US012730085B2

(12) United States Patent
Voronin et al.

(10) Patent No.: US 12,730,085 B2
(45) Date of Patent: Sep. 8, 2026

(54) APPARATUS AND METHOD FOR PLASMA MEASUREMENT

(71) Applicant: Tokyo Electron Limited, Tokyo (JP)

(72) Inventors: Sergey Voronin, Albany, NY (US); Carl Smith, Albany, NY (US); Nicholas Smieszek, Albany, NY (US); Qi Wang, Albany, NY (US); Akiteru Ko, Albany, NY (US); James Grootegoed, Albany, NY (US); Norman Jacobson, Albany, NY (US); Ronald Nasman, Albany, NY (US); Cheryl Alix, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 185 days.

(21) Appl. No.: 18/443,479

(22) Filed: Feb. 16, 2024

(65) Prior Publication Data

US 2025/0264430 A1 Aug. 21, 2025

(51) Int. Cl.

*G01N 27/22* (2006.01)
*H01J 37/32* (2006.01)
*H10P 72/00* (2026.01)
*H10P 74/00* (2026.01)

(52) U.S. Cl.

CPC ........ *G01N 27/22* (2013.01); *H01J 37/32935* (2013.01); *H10P 72/0604* (2026.01); *H10P 74/23* (2026.01); *H01J 37/3211* (2013.01); *H01J 2237/24564* (2013.01)

(58) Field of Classification Search

None

See application file for complete search history.

(56) References Cited

U.S. PATENT DOCUMENTS

2010/0213079 A1* 8/2010 Willis ................ G01N 27/3273 204/403.06

OTHER PUBLICATIONS

Coburn, J.W. et al., "Positive-ion bombardment of substrates in rf diode glow discharge sputtering," J. Appl. Phys., vol. 43, No. 12, Dec. 1972, 8 pages, Published by the American Institute of Physics.

Czarnetzki, U. et al., "The electrical asymmetry effect in capacitively coupled radio-frequency discharges," Plasma Sources Sci. Technol., 20, Apr. 1, 2011, 16 pages, IOP Publishing.

Faraz, T. et al., "Precise ion energy control with tailored waveform biasing for atomic scale processing," Journal of Applied Physics, 128, Dec. 7, 2020, 10 pages, AIP Publishing.

Gahan, D. et al. "Ion energy distribution measurements in rf and pulsed dc plasma discharges," Plasma Sources Sci. Technol., vol. 21, No. 2, Apr. 4, 2012, 9 pages, IOP Publishing.

Huang, S. et al., "Plasma etching of high aspect ratio features in SiO2 using Ar/C4F8/O2 mixures: A computational investigation," J. Vac. Sci. Technol. A, vol. 37, No. (3), Apr. 17, 2019, 27 pages, Published by the AVS.

(Continued)

*Primary Examiner* — Farhana A Hoque

(74) *Attorney, Agent, or Firm* — Slater Matsil, LLP

(57) ABSTRACT

An apparatus for plasma measurement includes an electrode within a remote capacitive sensor, a capacitor within the remote capacitive sensor, and a capillary array disposed within a top surface of the remote capacitive sensor. The capacitor is coupled with the electrode. The capillary array is configured to allow charged particles to pass through the capillary array and charge the capacitor.

20 Claims, 14 Drawing Sheets

(56) References Cited

OTHER PUBLICATIONS

Ignacio Ulacia F., J. et al., "Crystal-Orientation Dependent Etch Rates and a Trench Model for Dry Etching," J. Electrochem. Soc.: Solid-State Science and Technology, vol. 135, No. 6, Jun. 1988, 6 pages.
Kruger, F. et al., "Voltage waveform tailoring in radio frequency plasmas for surface charge neutralization inside etch trenches," Plasma Sources Sci. Technol., 28, Jul. 31, 2019, 14 pages, IOP Publishing.
Kurihara, K. et al., "Fabrication of Capillary Plate with Sub-Micron Holes for Investigating High-Aspect-Ratio Etching Characteristics," Japanese Journal of Applied Physics, vol. 39., Part 1, No. 3A, Mar. 2000, 3 pages.
Kurihara, K. et al., "Plasma characteristics observed through high-aspect-ratio holes in C4F8 plasma," Plasma Sources Sci. Technol., 5, Jan. 19, 1996, 6 pages.
Matsui, J. et al., "Effect of aspect ratio on topographic dependent charging in oxide etching," J. Phys. D: Appl. Phys., 34, Sep. 18, 2001, 7 pages, Institute of Physics Publishing.
Ohiwa, T. et al., "Mechanism of Etch Stop in High Aspect-Ratio Contact Hole Etching," Japanese Journal of Applied Physics, vol. 37, Part 1, No. 9A, Sep. 1998, 5 pages.

* cited by examiner

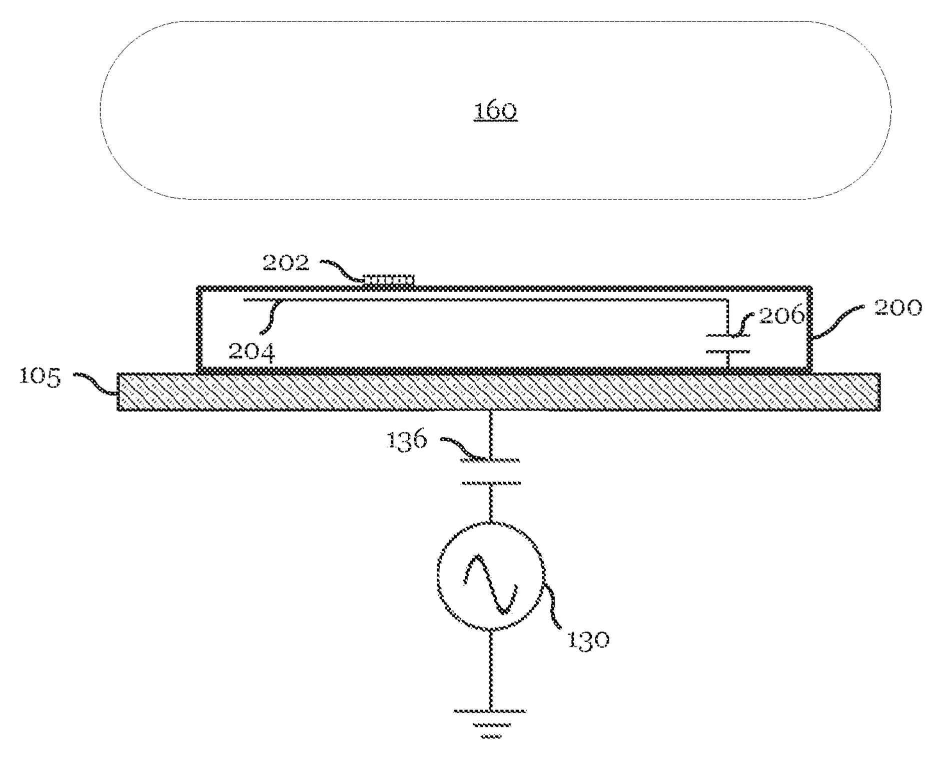
FIG. 2A
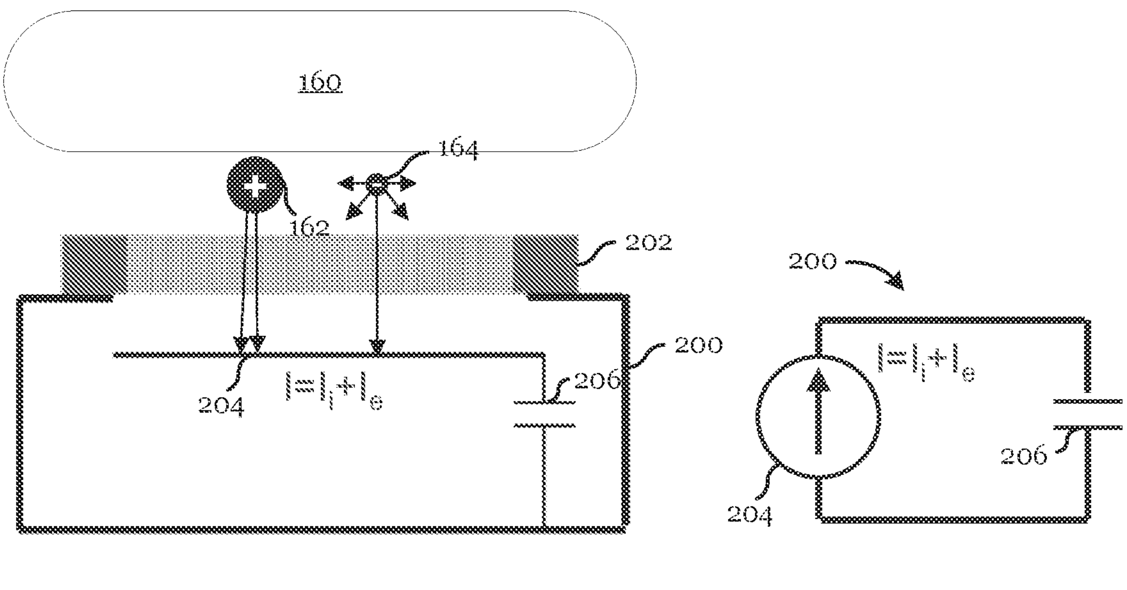
FIG. 2B
FIG. 2C

APPARATUS AND METHOD FOR PLASMA MEASUREMENT

TECHNICAL FIELD

The present invention relates generally to plasma processing, and, in particular embodiments, to apparatuses and methods for plasma measurement.

BACKGROUND

Device formation within microelectronic workpieces can involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes. As device structures densify and develop vertically, the desire for precision material processing becomes more compelling.

Plasma processes are commonly used to form devices, interconnects, and contacts in microelectronic workpieces. For example, plasma etching and plasma deposition are common process steps during semiconductor device fabrication. A combination of source power (SP) applied to a coupling element and bias power (BP) applied to a substrate holder can be used to generate and direct charged species from plasma. Various conditions during a plasma process may influence interactions of plasma ions with substrates and resulting effectiveness of etching. As such, improved measurement of plasma processes is desirable.

SUMMARY

In accordance with an embodiment, an apparatus for plasma measurement includes: an electrode within a remote capacitive sensor; a capacitor within the remote capacitive sensor, the capacitor coupled with the electrode; and a capillary array disposed within a top surface of the remote capacitive sensor, the capillary array being configured to allow charged particles to pass through the capillary array and charge the capacitor.

In accordance with another embodiment, an apparatus for plasma measurement includes: a first conductive layer over a substrate; a first dielectric layer over the first conductive layer; a second conductive layer over the first dielectric layer; a mask layer over the second conductive layer; a first hole through the mask layer, the second conductive layer, and the first dielectric layer, the first hole exposing a first portion of the first conductive layer; a first readout hole through the mask layer, the second conductive layer, and the first dielectric layer, the first hole exposing a second portion of the first conductive layer, the second portion having a greater surface area than the first portion; and a second readout hole through the mask layer and the first dielectric layer, the second readout hole exposing a third portion of the second conductive layer, the third portion having a greater surface area than the first portion.

In accordance with yet another embodiment, a method for plasma measurement includes a test cycle, the test cycle including: setting an initial voltage on a capacitor of a remote capacitive sensor; loading the remote capacitive sensor into a process chamber; performing a plasma process in the process chamber while the remote capacitive sensor is in the process chamber; removing the remote capacitive sensor from the process chamber; and reading out voltage of the capacitor from the remote capacitive sensor.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates a cross-sectional view of a remote sensor, in accordance with some embodiments;

FIG. 2B illustrates another cross-sectional view of a remote sensor, in accordance with some embodiments;

FIG. 2C illustrates a schematic diagram of a circuit, in accordance with some embodiments;

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to apparatuses and methods for plasma measurement, such as for in situ sensors of plasma processes. A reliable, easy to use, and low contamination or contamination-free remote sensor (in other words, a wireless sensor that may be wafer based) to be used in vacuum conditions for measuring various plasma and ion transport parameters (e.g., ion energy distribution (IED), ion angular distribution (IAD), ion flux, electron density, or the like) is desirable. The remote sensor for plasma current and voltage measurements may be based on the charging of a passive element (e.g., a capacitor) by current from the plasma. The remote sensor may be a mechanical assembly (e.g., a conductive enclosure comprising miniature electrodes and capacitors within it or the like) or an integrated wafer. For example, the remote sensor may be an integrated wafer formed on a single silicon wafer substrate, on which planar capacitors are formed by thin layers of conductive material separated by dielectric layers. As such, the remote sensor (e.g., an integrated wafer) may be free of potentially leaky batteries, transistors, and integration complexity. The remote sensor may be chucked and dechucked (in other words, mounted and removed from a substrate holder such as an electrostatic chuck) using standard wafer mounting and removal processes. As the remote sensor is used within a plasma processing chamber without wired connections to outside of the chamber, RF noise-free measurements may be made using the remote sensor after the completion of plasma processes. This may be useful for applications such as high aspect ratio (HAR) etching processes or the like.

Figure 1:
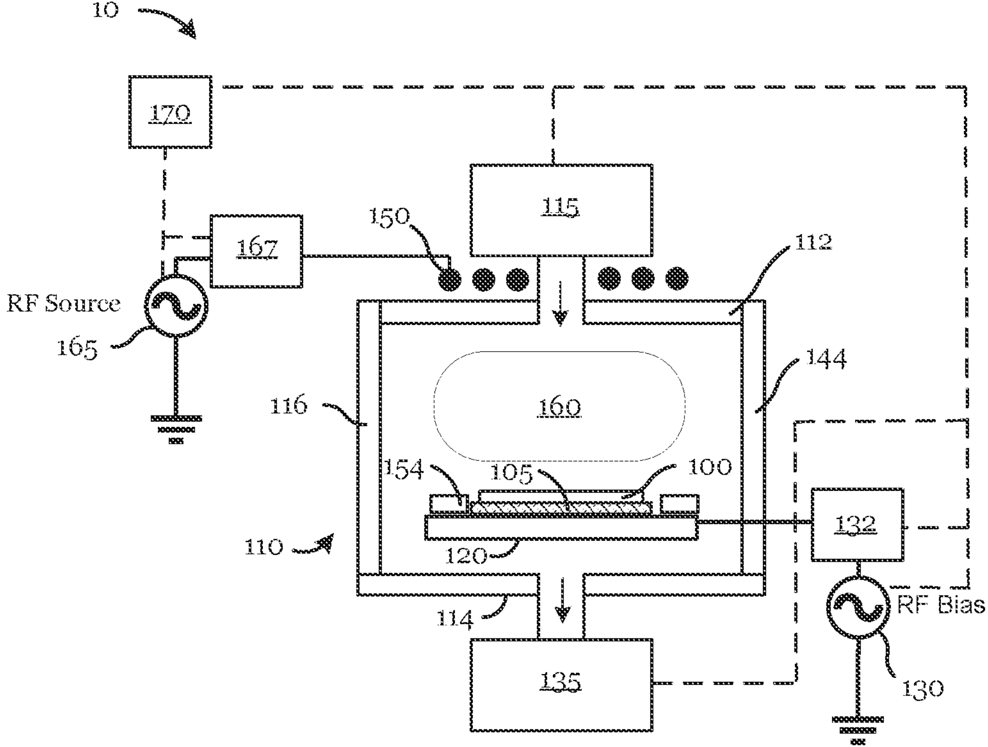
FIG. 1 illustrates an example plasma processing system.

FIG. 1 illustrates an example plasma processing system 10. As illustrated in FIG. 1, the plasma processing system 10 comprises a plasma processing chamber 110 with source power excitation and substrate bias power (in other words, wafer biasing capabilities). The plasma processing chamber 110 comprises a top plate 112, a bottom plate 114, and a side wall 116. The top plate 112, bottom plate 114, and side wall 116 may be conductive and electrically connected to the system ground (a reference potential).

Further in FIG. 1, an antenna 150 used for inductively coupled plasma (ICP) is located outside the plasma processing chamber 110, positioned above a top plate 112. In various examples, the antenna 150 is a conductive helical coil electrode used to inductively ignite and couple power to a plasma 160 inside the plasma processing chamber 110. However, any suitable antenna 150 may be used. The antenna 150 may be coupled to a radio frequency (RF) source 165 via a matching circuit 167.

In other examples, a boundary electrode (e.g., a conductive plate) is used for capacitively coupled plasma (CCP) to capacitively ignite and couple power from the radio frequency (RF) source 165 to the plasma 160. The boundary electrode may be located above the plasma processing chamber 110, such as above or on the top plate 112, or inside the plasma processing chamber 110, such as under the top plate 112.

The matching circuit 167 typically includes one or more capacitors and inductors. In examples, the capacitors and inductors may be variable. The forward and reflected power at the matching circuit 167 can be measured, and the matching circuit 167 is used to match the plasma impedance. For example, a feedback loop circuit may be used to adjust the variable capacitors and inductors.

A substrate 100 may be placed on a substrate holder 105 in the plasma processing chamber 110. In various examples, the substrate 100 is a remote sensor used for measuring various plasma and ion transport parameters such as ion energy distribution (IED), ion angular distribution (IAD), ion flux, electron density, or the like. The substrate 100 may also be a semiconductor wafer used for manufacturing various semiconductor devices such as integrated circuits.

In various examples, the plasma processing system 10 may further comprise a focus ring 154 positioned over a bottom electrode 120 to surround the substrate 100. The focus ring 154 may advantageously maintain and extend the uniformity of a plasma 160 to achieve process consistency at the edge of the substrate 100. In various examples, the focus ring 154 may have a width of a few centimeters. In various examples, there may be a gap for mechanical clearance between the circumference of the substrate 100 and the focus ring 154. In certain examples, the gap may be hundreds of microns to a few millimeters. In various examples, the focus ring 154 comprises a dielectric material with a desired dielectric constant. In certain examples, the focus ring 154 comprises silicon. Some examples of silicon-based focus ring comprise silicon, silicon oxide, doped silicon (e.g., boron-doped, nitrogen-doped, and phosphorous-doped), or silicon carbide. Alternatively, in some examples, the focus ring comprises a carbon-based material. In one or more examples, the focus ring 154 may comprise a metal oxide, such as aluminum oxide and zirconium oxide.

A process gas is introduced into the plasma processing chamber 110 by a gas delivery system 115. The gas delivery system 115 may comprise multiple gas flow controllers to control the flow of multiple gases into the plasma processing chamber 110. Any precursors that can create a plasma may be used, such as argon (Ar), tetrafluoromethane ($CF_4$), oxygen ($O_2$), an admixture of tetrafluoromethane and oxygen ($CF_4/O_2$), chlorine ($Cl_2$), fluoromethane ($CH_3F$), trifluoromethane ($CHF_3$), difluoromethane ($CH_2F_2$), hexafluorobutadiene ($C_4F_6$), octafluorocyclobutane ($C_4F_8$), nitrogen ($N_2$), hydrogen ($H_2$), hydrogen bromide (HBr), the like, or any combination, or admixture thereof in any suitable ratio. In some examples, optional center/edge splitters may be used to independently adjust the gas flow rates at the center and edge of the substrate 100. In various examples, the total flow rate of the gas is in a range of 1 standard cubic centimeters per minute (sccm) to 5000 sccm, at a pressure in a range of 0.1 mTorr to 1 Torr, and/or at a temperature in a range of −200° C. to 500° C.

The gas delivery system 115 may have a showerhead configuration positioned at the top of the plasma processing chamber 110 covering the entirety of the substrate 100, including a plurality of appropriately spaced gas inlets. Alternatively, gas may be introduced through dedicated gas inlets of any other suitable configuration. The plasma processing chamber 110 may further be equipped with one or more sensors such as voltage-current sensors, pressure monitors, gas flow monitors, and/or gas species density monitors. The sensors may be integrated as a part of the gas delivery system 115 in various examples.

In FIG. 1, the plasma processing chamber 110 is a vacuum chamber and may be evacuated using one or more vacuum pumps 135, such as a single stage pumping system or a multistage pumping system (e.g. a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 100).

In various examples, the substrate holder 105 may be integrated with, or a part of, a chuck (e.g., a circular electrostatic chuck (ESC)) positioned near the bottom of the plasma processing chamber 110, and connected to a bottom electrode 120. The surface of the chuck or the substrate holder 105 may be coated with a conductive material (e.g., a carbon-based or metal-nitride based coating). The substrate 100 may be optionally maintained at a desired temperature using a temperature sensor and a heating element connected to a temperature controller (not shown). In certain examples, the temperature sensor may comprise a thermocouple, a resistance temperature detector (RTD), a thermistor, or a semiconductor based integrated circuit. The heating element may for example comprise a resistive heater in one example. In addition, there may be a cooling element such as a liquid cooling system coupled to the temperature controller.

The bottom electrode 120 may be coupled to a RF bias source 130, such as through a matching circuit 132. The matching circuit 132 may comprise similar components in similar configurations as described above for the matching circuit 167, and the details are not repeated herein. In some examples, the RF bias source 130 provides a sinusoidal waveform to the bottom electrode 120.

The plasma processing system 10 further comprises a controller 170 to control plasma processing and adjust parameters in real time. In some examples, the controller 170 is a programmable processor, microprocessor, computer, or the like. Although the controller 170 is illustrated as a single element for illustrative purposes, the controller 170 may include additional elements or be part of a single element. The controller 170 may be programmable by instructions stored in software, firmware, hardware, or a combination thereof. The controller 170 may be coupled to the RF source 165, the matching circuit 167, the RF bias source 130, the matching circuit 132, the gas delivery system 115, and/or the one or more vacuum pump(s) 135. The controller 170 may be configured to set, monitor, and/or control various control parameters associated with generating a plasma and delivering ions to the surface of a microelectronic workpiece (e.g., the substrate 100). Control parameters may include, but are not limited to, power level, frequency, and duty cycle (%) for the source power, the bias power, and the DC voltage. Other control parameter sets may also be used.

In some examples, the excitation frequency range for the RF source power is in a range of 100 kHz to 5 GHz, such as 1 MHz to 5 GHz, and when operated in a pulsing mode the modulation frequency is in a range of 0.01 Hz to 10 kHz. While only one RF source 165 is illustrated in FIG. 1, more than one RF source(s) 165 may be used in various examples, for example, to provide a low frequency RF power and a high frequency RF power at the same time.

In some examples, the operating frequency range for the RF bias power is 10 kHz to 40 MHz. However, any suitable frequency range may be used. In some examples, the modulation frequency range for the DC pulse power is 10 kHz to 10 MHz with a DC pulse duty cycle in a range of 5% to 90%. While only one RF bias source 130 is illustrated in FIG. 1, more than one RF bias source(s) may be used in various examples, for example, to provide a low frequency bias RF power and a high frequency bias RF power at the same time and enable changing the bias RF frequency more rapidly.

The configuration of the plasma etching system described above with respect to FIG. 1 is for example only. In alternative examples, various alternative configurations may be used for a plasma processing system that incorporates a set of electromagnets. For example, the plasma processing system may be a resonator such as a helical resonator that produces helicons. Further, microwave plasma (MW), electron cyclotron resonance (ECR), multi-frequency CCP, or other suitable systems may be used. In various examples, the RF power, chamber pressure, substrate temperature, gas flow rates and other plasma process parameters may be selected in accordance with the respective process recipe.

In addition, embodiments of the present invention may be also applied to remote plasma systems as well as batch systems. For example, the substrate holder may be able to support a plurality of remote sensors and/or semiconductor substrates (e.g., wafers) that are spun around a central axis as they pass through different plasma zones. Accordingly, it is possible to have multiple plasma zones, for example, including a metal-containing plasma zone, metal-free plasma zone, and plasma-free zone (e.g., a purge zone).

Embodiments of the disclosure are described in the context of the accompanying drawings. Embodiments of a remote sensor and its operation will be described using FIGS. 2A-E. Embodiments of integrated wafers will be described using FIGS. 3-6. An embodiment of a voltmeter circuit will be described using FIG. 7. Embodiments of processes for manufacturing integrated wafers will be described using FIGS. 8-15. Embodiments of methods for plasma processing will be described using FIGS. 16 and 17.

FIGS. 2A-C illustrate various schematics of a remote sensor 200 (also referred to as a remote capacitive sensor or capacitive sensor), in accordance with some embodiments. FIG. 2A illustrates a cross-sectional view of a remote sensor 200 on a substrate holder 105, such as in a plasma processing system 10 (see above, FIG. 1). The substrate holder 105 receives a bias voltage from an RF bias source 130. In some embodiments, the RF bias source 130 is coupled to the substrate holder 105 across a capacitor 136, which may be part of a matching circuit 132 (see above, FIG. 1). The bias voltage attracts charged particles from a plasma 160 (e.g., ions or electrons) above the substrate holder 105 towards a top surface of the remote sensor 200, just as charged particles from the plasma 160 would bombard a semiconductor substrate or the like during a plasma process (such as for etching, deposition, the like, or a combination thereof).

A capillary array 202 is coupled to a top surface of the remote sensor 200. The capillary array 202 comprises an array of high aspect ratio (HAR) openings (also referred to as capillaries). In various embodiments, the capillary array 202 comprises a conductive material, a dielectric material, or a combination thereof. The high aspect ratio capillaries have similar profiles as high aspect ratio features formed during various semiconductor manufacturing processes (e.g., HAR etching processes) and can be used to measure the expected rates and amounts of charged particles that can pass through openings of similar shapes and sizes.

The remote sensor 200 further comprises one or more simple integrated circuits, each comprising, for example, one or more collecting electrodes (e.g., an electrode 204) and miniature capacitors (e.g., a capacitor 206, also referred to as a built-in capacitor) for charge current collection and accumulation, respectively. The one or more integrated circuits may be disposed in the interior of the remote sensor 200, which may be any suitable mechanical assembly. For example, the remote sensor 200 may be a conductive enclosure such as a box or other container comprising a conductive material (e.g., a metal such as copper, aluminum, or the like). The high aspect ratio capillaries of the capillary array 202 extend through the top surface of the remote sensor 200 to expose one or more electrode(s) 204. Charged particles from the plasma 160 pass through the capillary array 202 and are collected by the one or more electrode(s) 204 that are coupled to one or more respective capacitors 206. In various embodiments, the capillaries of the capillary array 202 have diameters smaller than the Debye length $\lambda_D$ [cm]=740 $(kT_e/n_e)^{0.5}$, where $\lambda_D$ is in centimeters, $kT_e$ is the energy of the plasma electrons in eV, and $n_e$ is the electron density in $cm^{-3}$.

FIG. 2B illustrates another cross-sectional view of the remote sensor 200 with the capillary array 202 drawn proportionately larger and FIG. 2C illustrates a schematic diagram of a circuit representing a circuit of the remote sensor 200 comprising an electrode 204 (represented as a current source) and capacitor 206. The electrode 204 may represent the sum total of all charge current collection electrodes of the remote sensor, and the capacitor 206 may represent the sum total circuit capacitance of the one or more integrated circuit(s) of the remote sensor 200. Ions 162 and/or electrons 164 of the plasma 160 pass through the capillaries of the capillary array 202 and are collected by the electrode 204. The plasma current I is the sum current of the ion current $I_i$ from the collected ions 162 and electron current $I_e$ from the collected electrons 164, which are functions of the aspect ratio of the capillaries of the capillary array 202, the geometry of the current collection area of the electrode 204, and conditions of the plasma 160. The plasma current I charges the capacitor 206 at a rate of $$\frac{dV}{dt} = \frac{I_e + I_i}{C},$$

where C is the capacitance of the capacitor 206 (in other words, the circuit capacitance of the one or more integrated circuit(s) of the remote sensor 200). The capacitance C and the geometry of the capillaries of the capillary array 202 (including the capillary diameters, the aspect ratio (AR) of the capillaries, and the number of capillaries) are selected to provide a charging rate $$\frac{dV}{dt}$$

in a range of 0.01 V/sec to 100 V/sec. This may provide a reasonable current collection time, such as in a range of seconds to tens of minutes. As an example, if the capacitance C is 1 μF and the plasma current I is 1 μA, the charging rate $$\frac{dV}{dt}$$

will be 1 V/sec. As such, it will take 50 seconds to change the voltage on the capacitor 206 by 50 V.

Figure 2D:
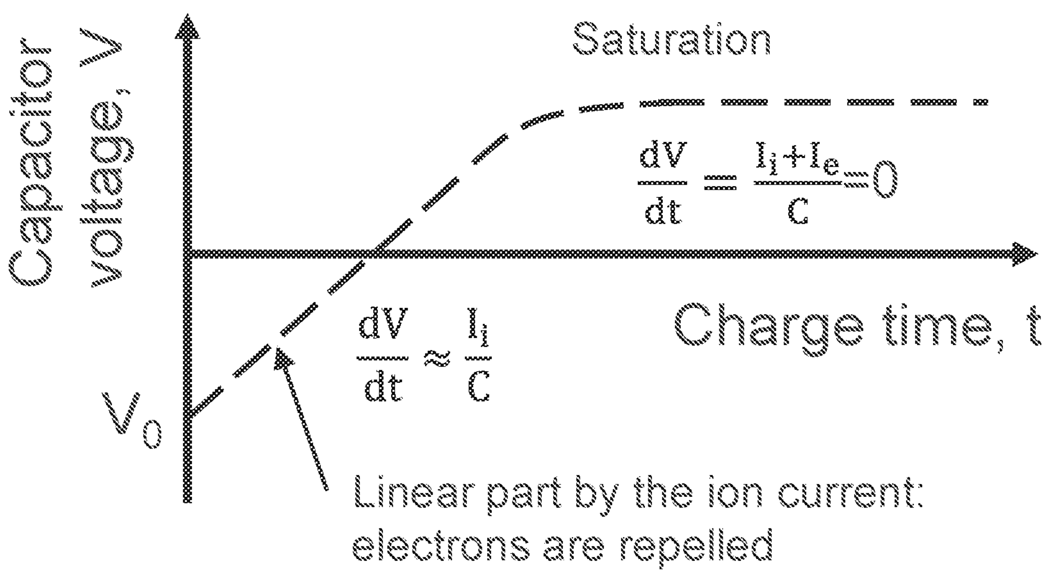
FIGS. 2D and 2E illustrate graphs of capacitor charging from plasma current, in accordance with some embodiments.

FIG. 2D illustrates a graph of capacitor charging of the remote sensor 200 by the ion current $I_i$ for estimating ion angular distribution (IAD), in accordance with some embodiments. The preset capacitor potential $V_0$ of the capacitor 206 may be set to a negative value (in other words, $V_0 < V_{sh}$, the sheath voltage of the plasma) to repel electrons of the electron current $I_e$. As such, the plasma current I that charges the capacitor 206 may be approximated as just the ion current $I_i$. As illustrated by FIG. 2D, the capacitor voltage V of the capacitance of the remote sensor 200 (e.g., the capacitance of the capacitor 206) will charge linearly in proportion to the ion current $I_i$ until saturation is reached at a maximum voltage that is proportional to the sheath voltage of the plasma. When saturation is reached, the electrons of the electron current $I_e$ are no longer repelled and $$\frac{dV}{dt} = \frac{I_e + I_i}{C} = 0.$$

Therefore if charging is halted before saturation is reached, the ion current $I_i$ can be calculated from the difference of the final voltage $V_f$ on the capacitor minus the preset capacitor potential $V_0$ multiplied by the capacitance C and divided by the total charging time.

The ion current $I_{iB}$ at the bottom of a feature (e.g., a high aspect ratio opening or via such as a capillary of the capillary array 202) is a function of the aspect ratio (AR) of the feature; in other words, $I_{iB}=I_i(AR)$. For an incident angle θ, an ion flux at the bottom of the feature is:

$$\frac{I_{iB}}{I_{iS}} = \sqrt{\frac{2}{\pi\sigma}} \int_0^{atan(1/2AR)} \left[\exp\left\{-\frac{\theta^2}{2\sigma^2}\right\}\right] d\theta,$$

where $I_{iB}$ and $I_{iS}$ are the ion currents at the surface and the bottom of the feature, respectively, AR is the aspect ratio of the feature, and σ is the standard deviation of the ion angle distribution (IAD). This may be Gaussian for a plasma with collisionless sheath, such as a function of incident angle θ:

$$f(\theta) \propto \exp\left\{-\frac{eV_{sh}}{kT_i}\theta^2\right\},$$

where $V_{sh}$ is the sheath voltage of the plasma and $T_i$ is the ion temperature. In other words, the ion angular distribution (IAD) depends on the sheath voltage, and here it can be estimated from different via bottom ion currents (in other words, ion currents at the bottoms of features) corresponding to particular via aspect ratios.

Figure 2E:
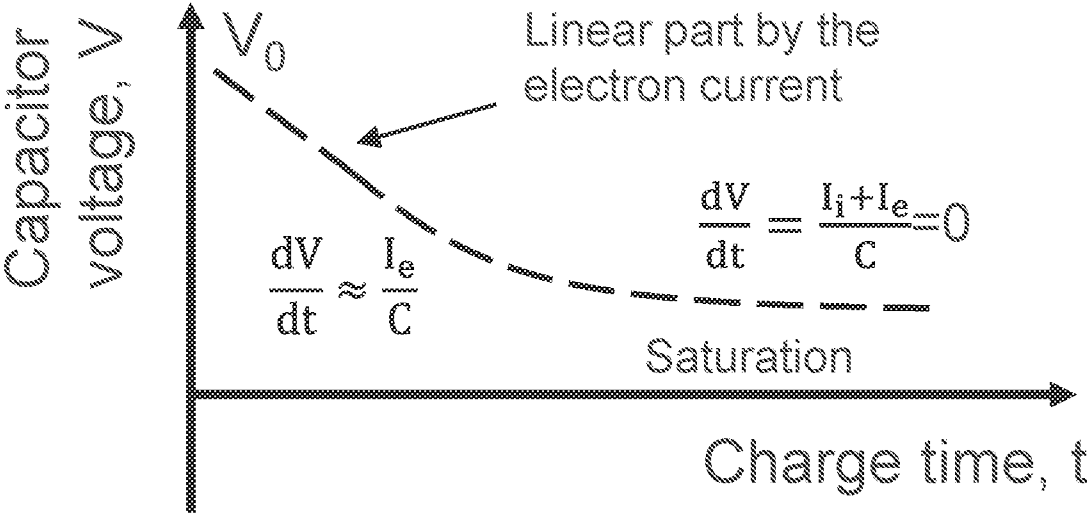

FIG. 2E illustrates a graph of capacitor charging of the remote sensor 200 by the electron current $I_e$ for estimating plasma density (in other words, the electron density $n_e$ of the plasma), in accordance with some embodiments. The preset capacitor potential $V_0$ of the capacitor 206 may be set to a positive value (in other words, $V_0 > V_{sh}$, the sheath voltage of the plasma) to repel ions of the ion current $I_i$. As such, the plasma current I that charges the capacitor 206 may be approximated as just the electron current $I_e$. As illustrated by FIG. 2E, the capacitor voltage V of the capacitance of the remote sensor 200 (e.g., the capacitance of the capacitor 206) will charge linearly in proportion to the electron current $I_e$ until saturation is reached at a minimum voltage that is proportional to the sheath voltage of the plasma. When saturation is reached, the ions of the ion current $I_i$ are no longer repelled and $$\frac{dV}{dt} = \frac{I_e + I_i}{C} = 0.$$

Therefore if charging is halted before saturation is reached, the electron current $I_i$ can be calculated from the difference of the final voltage $V_f$ on the capacitor minus the preset capacitor potential $V_0$ multiplied by the capacitance C and divided by the total charging time.

The electron current $I_{eB}$ at the bottom of a feature (e.g., a high aspect ratio opening such as a capillary of the capillary array 202) is a function of the aspect ratio (AR) of the feature; in other words, $I_{eB}=I_e(AR)$. The electrons of the plasma may be Maxwellian with an isotropic velocity distribution. As such, we can estimate the electron current on the surface of the feature Les which may have a direct correlation with the electron density $n_e$ of the plasma.

Figure 3:
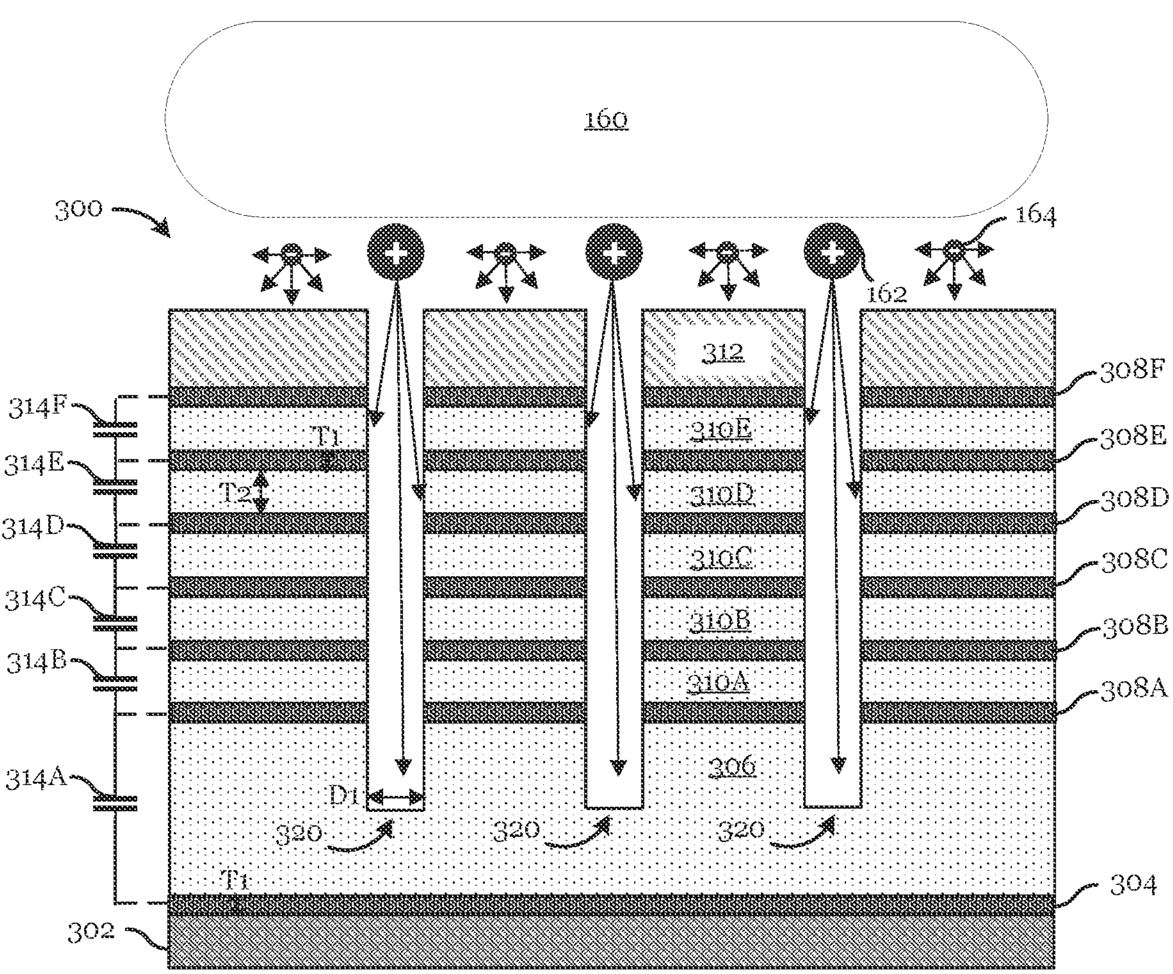
FIG. 3 illustrates a cross-sectional view of an integrated wafer, in accordance with some embodiments.

FIG. 3 illustrates a cross-sectional view of an integrated wafer 300 that functions as a remote sensor analogous to the remote sensor 200 (see above, FIGS. 2A-2C), in accordance with some embodiments. The integrated wafer 300 comprises conductive layers deposited on top of dielectric material to form steps that are a series of planar capacitors. The integrated wafer 300 may be manufactured by standard semiconductor manufacturing processes.

In various embodiments, the integrated wafer 300 is manufactured over a substrate 302. In one or more embodiments, the substrate 302 may be a semiconductor wafer such as a silicon wafer or a silicon-on-insulator (SOI) wafer. In certain embodiments, the substrate 302 may comprise a silicon germanium wafer, silicon carbide wafer, gallium arsenide wafer, gallium nitride wafer and other compound semiconductors. In other embodiments, the substrate 302 comprises heterogeneous layers such as silicon germanium on silicon, gallium nitride on silicon, silicon carbon on silicon, as well layers of silicon on a silicon or SOI substrate.

A conductive layer 304 is formed over the substrate 302. The conductive layer 304 comprises a suitable conductive material such as a metal. For example, the conductive material may be a metal such as tungsten (W) or a conductive composition such as titanium nitride (TiN). However, any suitable conductive material (e.g., ruthenium (Ru), tin (Sn), copper (Cu) titanium (Ti), hafnium (Hf), silver (Ag), gold (Au), cobalt (Co), nickel (Ni), molybdenum (Mb), niobium (Nb), tantalum (Ta), rhodium (Rh), iridium (Ir), palladium (Pd), indium (In), zinc (Zn), antimony (Sb), silicon (Si) doped with boron (B), arsenic (As), phosphorus (P), or gallium (Ga), tantalum nitride (TaN), the like, or a combination thereof) and deposition method (e.g., electroplating, electroless plating, ALD, PVD, the like, or a combination thereof) may be used. In some embodiments, the conductive layer has a first thickness T1 in a range of 2 nm to 100 μm.

A dielectric layer 306 is formed over the conductive layer 304. The dielectric layer 306 comprises a suitable dielectric material such as silicon oxide, silicon dioxide, silicon nitride, silicon carbide, a silicon-based dielectric material with a low dielectric constant (i.e., low-k value) (e.g., organosilicate glass (SiCOH), dense SiCOH, porous SiCOH, and other porous dielectric materials), silicon oxynitride ($SiO_xN_y$), aluminum oxide ($Al_2O_3$) the like, or a combination thereof. The dielectric material may be formed with a suitable process such as CVD, PECVD, ALD, spin-on, the like, or a combination thereof. However, any suitable process may be used to form the dielectric material for the dielectric layer 306.

Additional conductive layers 308A, 308B, 308C, 308D, 308E, and 308F and dielectric layers 310A, 310B, 310C, 310D, and 310E are subsequently formed alternately over the dielectric layer 306, so that each pair of the conductive layers 308A-F is separated by a respective dielectric layer of the dielectric layers 310A-E to form a multi-layer stack. The conductive layers 308A-F and dielectric layers 310A-E may be formed using similar materials and methods as described above for the conductive layer 304 and the dielectric layer 306, respectively, and the details are not repeated herein.

In various embodiments, the dielectric layers 310A-E have respective second thicknesses T2 in a range of 2 nm to 100 μm. The dielectric layer 306 may also have a thickness substantially similar to the second thickness T2, or it may have a greater thickness. In some embodiments, the conductive layers 308A-F have respective same thicknesses as the first thickness T1 of the conductive layer 304. In other embodiments, one or more of the conductive layers 308A-F have greater or lesser respective thicknesses than the first thickness T1 of the conductive layer 304. Although FIG. 3 illustrates the multi-layer stack as having seven conductive layers 304 and 308A-F alternating with six dielectric layers 306 and 310A-E, any suitable numbers of alternating conductive layers and dielectric layers may be formed and are within the scope of the disclosed embodiments.

A mask layer 312 is formed over the conductive layers 308A-F and dielectric layers 310A-E. In various embodiments, the mask layer 312 comprises amorphous carbon, titanium nitride, titanium, titanium oxide, tantalum, other tungsten based compounds, ruthenium based compounds, aluminum based compounds, amorphous silicon, silicon nitride, silicon carbide, silicon oxynitride, silicon oxycarbide, silicon carbonitride, silicon oxycarbonitride, tungsten carbide, the like, or a combination thereof. The mask layer 312 may be formed with a spin-on process, CVD, ALD, the like, or a combination thereof. However, any suitable materials and methods may be used to form the mask layer 312.

Holes 320 (also referred to as capillaries or vias) are formed through the mask layer 312, the alternating layers of the conductive layers 308A-F and dielectric layers 310A-E, and into the dielectric layer 306. In some embodiments, one or more hole(s) 320 extends through the dielectric layer 306 to expose the conductive layer 304. The holes 320 may be formed with a suitable lithography and etching process. For example, a photoresist may be formed and patterned over the mask layer 312. The patterned photoresist is then used as an etching mask for a suitable etching process (e.g., a reactive ion etching process or the like using anisotropic plasma etching) to form the holes 320. The holes 320 may be formed with respective diameters D1 in a range of 5 nm to 50 μm, such as 100 nm. In various embodiments, the diameters D1 are smaller than the Debye length $\lambda_D$ [cm]=740 $(kT_e/n_e)^{0.5}$, where $\lambda_D$ is in centimeters, $kT_e$ is the energy of the plasma electrons in eV, and $n_e$ is the electron density in $cm^{-3}$.

Planar capacitors 314A, 314B, 314C, 314D, 314E, and 314F are formed by pairs of adjacent conductive layers 304 and 308A-F across respective dielectric layers 306 and 310A-E. Although FIG. 3 illustrates six planar capacitors 314A-F, any suitable number of planar capacitors may be formed and are within the scope of the disclosed embodiments. Ions 162 and/or electrons 164 of the plasma 160 (such as produced in a plasma process chamber 110 while the integrated wafer 300 is mounted on a substrate holder 105; see above, FIG. 1) enter the holes 320 and charge the planar capacitors 314A-F. Each planar capacitor 314A-F may be represented by the conductive and corresponding dielectric layers; the capacitance of a parallel plate capacitor is described as $$C = \frac{k\varepsilon_0 A}{L},$$

where L is the length between the conductive layers making up each planar capacitor (for example, L may be the second thickness T2 of the respective dielectric layer between the conductive layers), A is the plate area of the planar capacitor, k is the relative permittivity of the dielectric layer, and $\varepsilon_0$ is the vacuum permittivity.

The planar capacitors 314A-F will be charged by the plasma current I at a rate $$\frac{dV}{dt} = \frac{NI}{C},$$

where N is the total number of holes 320 coupling to each capacitor and the plasma current I is the current from the plasma 160 per the electrode area of each hole 320, which in some embodiments may be $$\frac{\pi(D1)^2}{4}.$$

After being used to measure parameters of a plasma process by the charging of the planar capacitors 314A-F, the integrated wafer 300 may be unloaded from the process chamber and the charge on the planar capacitors 314A-F (e.g., the layer potentials of the respective conductive layers 304 and 308A-F) may be read out be a high ohmic voltmeter (see below, FIG. 7) and analyzed.

Figure 4:
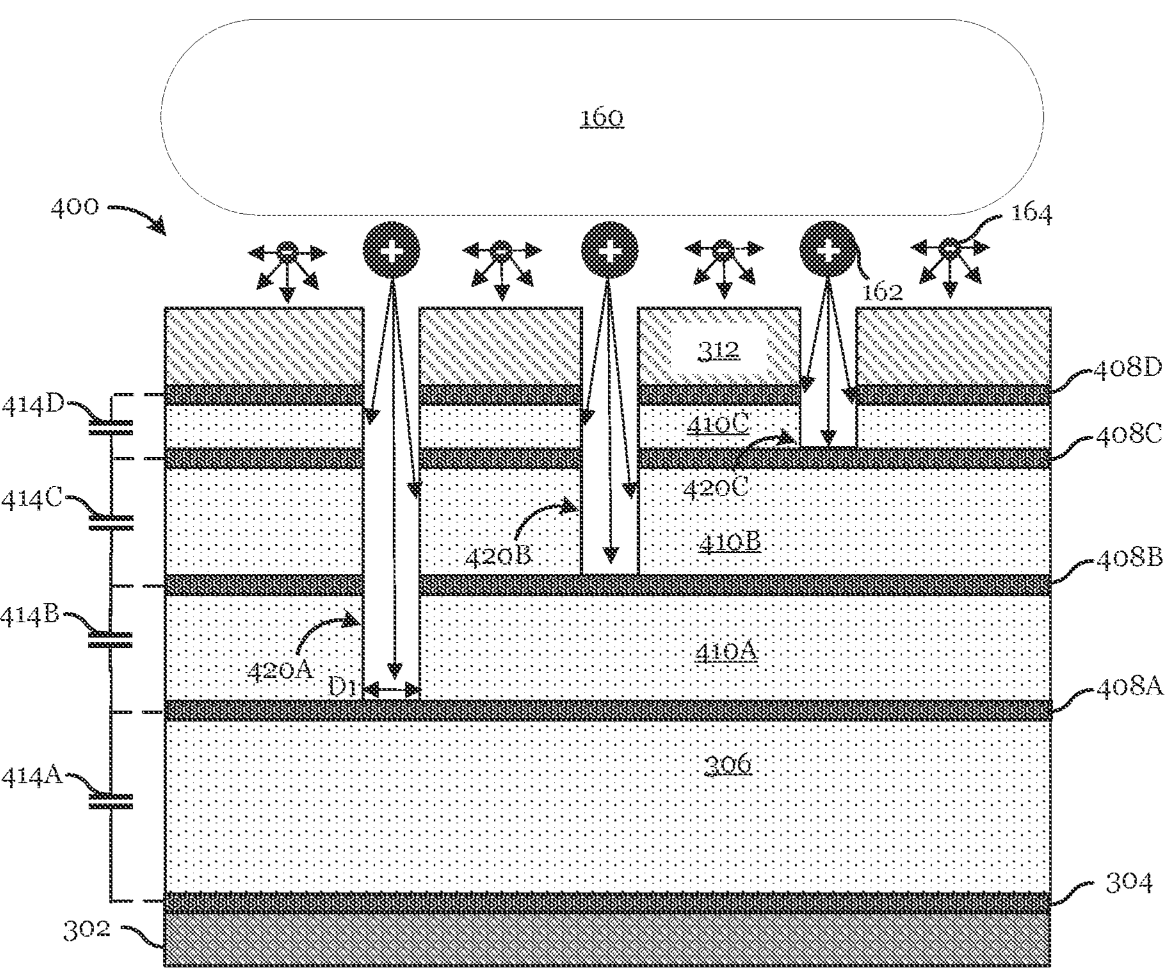
FIG. 4 illustrates another cross-sectional view of an integrated wafer, in accordance with some embodiments.

FIG. 4 illustrates a cross-sectional view of another integrated wafer 400 that is similar to the integrated wafer 300 (see above, FIG. 3) but with holes 420A, 420B, and 420B that extend to different conductive layers. The integrated wafer 400 may comprise similar features in similar configurations and manufactured with similar methods as described above for the integrated wafer 300, and the details are not repeated herein. As illustrated by FIG. 4, the hole 420A extends to expose the conductive layer 408A, the hole 420B extends to expose the conductive layer 408B, and the hole 420C extends to expose the conductive layer 408C. However, one or more holes may extend to expose any suitable number of the conductive layers of an integrated wafer similar to the integrated wafers 300 or 400, and all such combinations thereof are within the scope of the disclosed embodiments. Although FIG. 4 illustrates a multi-layer stack having five conductive layers 304, 408A, 408B, 408C, and 408D alternating with four dielectric layers 306, 410A, 410B, 410C, and 410D to form four planar capacitors 414A, 414B, 414C, and 414D, any suitable numbers of alternating conductive layers and dielectric layers may be formed and are within the scope of the disclosed embodiments.

Figure 5:
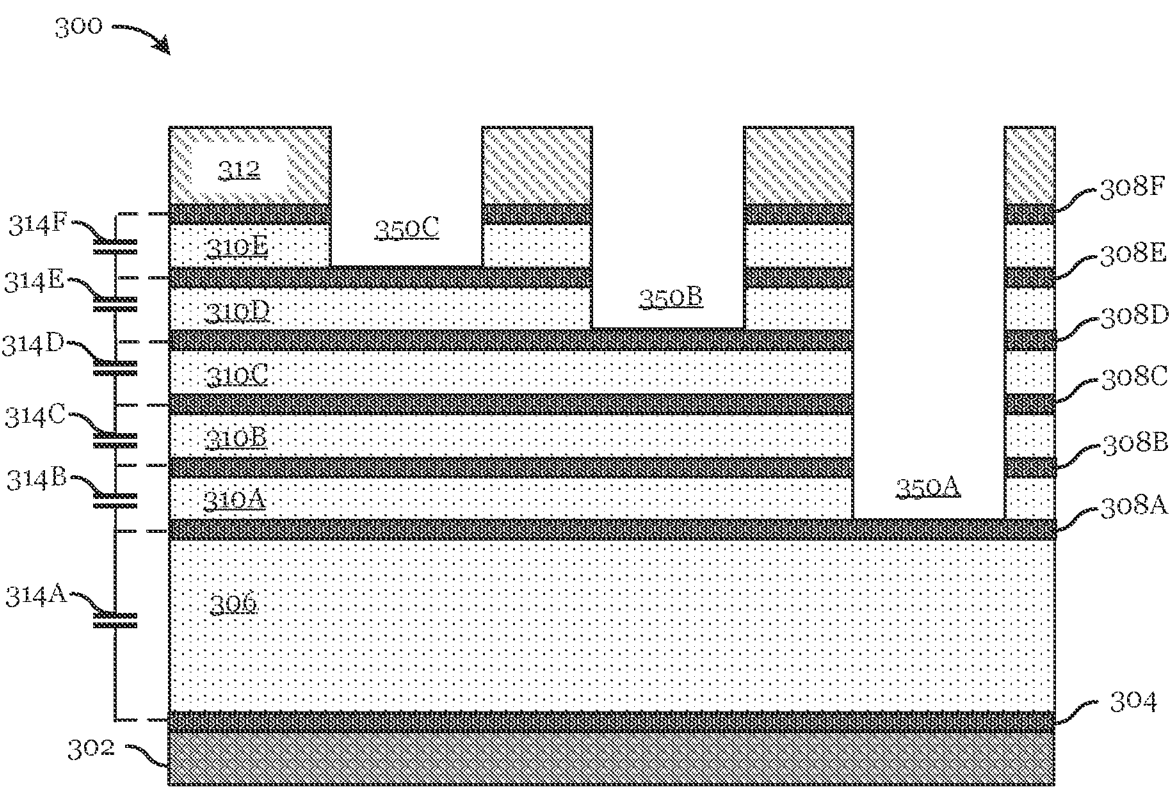
FIG. 5 illustrates another cross-sectional view of an integrated wafer, in accordance with some embodiments.

FIG. 5 illustrates another cross-sectional view of the integrated wafer 300 showing various readout holes, in accordance with some embodiments. As illustrated by FIG. 5, readout holes 350A, 350B, and 350C extend to expose top surfaces of the conductive layers 308A, 308D, and 308E, respectively. The exposed top surfaces of the conductive layers 308A, 308D, and 308E may also be referred to as contact pads, which have greater respective surface areas than the bottom surfaces of the holes 320 (see above, FIG. 3). In various embodiments, the readout holes 350A, 350B, and 350C have diameters in a range of 1 mm to 10 mm, such as 5 mm. The contact pads at the bottoms of each respective readout hole 350A-C may have circular, square, oval, rectangular, or any other suitable shapes as seen from a top view. Although FIG. 5 illustrates three readout holes 350A, 350B, and 350C, any suitable number of readout holes may be formed to expose any suitable number of the conductive layers of the integrated wafer 300, and all such combinations are within the scope of the disclosed embodiments.

During measurements (such as during operation of a plasma process that charges the capacitor(s) of the integrated wafer 300), the readout holes 350A, 350B, and 350C may be isolated, such as by being covered with tape or one or more attached piece(s) of conductor or dielectric material (e.g., a removeable shield 560 as described below with respect to FIG. 6, which may be made of a "process-friendly" material such as a piece of silicon or may comprise a metal). After the measurement process is completed, the integrated wafer 300 may be removed from the process chamber and the readout holes 350A, 350B, and 350C may be exposed and coupled with a highly ohmic voltmeter (see below, FIG. 7) for measurement of the voltages.

Figure 6:
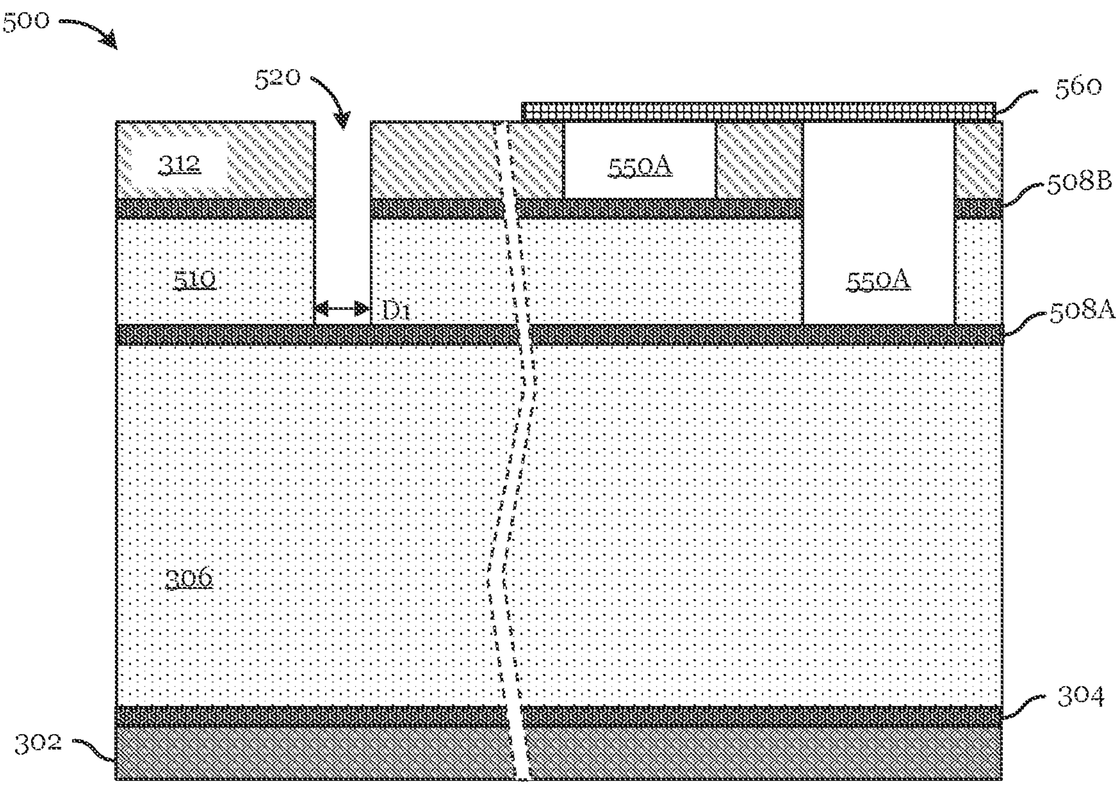
FIG. 6 illustrates another cross-sectional view of an integrated wafer, in accordance with some embodiments.

FIG. 6 illustrates an integrated wafer 500 with a simplified design, in accordance with some embodiments. The integrated wafer 500 may comprise similar features in similar configurations and manufactured with similar methods as described above for the integrated wafer 300 with respect to FIG. 3, and the details are not repeated herein. The integrated wafer 500 comprises a substrate 302, a conductive layer 304 over the substrate 302, a dielectric layer 306 over the conductive layer 304, a conductive layer 508A over the dielectric layer 306, a dielectric layer 510 over the conductive layer 508A, a conductive layer 508B over the dielectric layer 510, and a mask layer 312 over the conductive layer 508B.

A hole 520 extends to expose a surface of the conductive layer 508A in a first region of the integrated wafer 500 to allow charged particles (e.g., ions and electrons) to charge a capacitor formed by the conductive layer 508A, the dielectric layer 510, and the conductive layer 508B. The hole 520 may be similar to the holes 320 (see above, FIG. 3), and the details are not repeated herein. Although FIG. 6 illustrates one hole 520, any suitable number of holes 520 (such as an array of holes 520) may be formed to expose the conductive layer 508A.

In a second region of the integrated wafer 500, a readout hole 550A extends to expose a portion of the conductive layer 508A, and a readout hole 550B extends to expose a portion of the conductive layer 508B. The readout holes 550A and 550B may be similar to the readout holes 350A-C (see above, FIG. 5), and the details are not repeated herein. In various embodiments, the bottoms of the readout holes 550A and 550B comprise contact pads with surface areas in the square millimeter or square centimeter range. The contact pads of the readout holes 550A and 550B have greater respective surface areas than the bottom surface of the hole 520.

During measurements (such as during operation of a plasma process that charges the capacitor(s) of the integrated wafer 500), the readout holes 550A and 550B are isolated by being covered with a removeable shield 560 (e.g., a piece of tape or one or more attached piece(s) of conductor or dielectric material). After the measurement process is completed, the integrated wafer 500 may be removed from the process chamber and the readout holes 550A and 550B may be exposed and coupled with a highly ohmic voltmeter (see below, FIG. 7) for measurement of the voltages. The total capacitor voltage of the capacitor formed by the formed by the conductive layer 508A, the dielectric layer 510, and the conductive layer 508B is $V=\varphi_{bottom}-\varphi_{top}$, where $\varphi_{bottom}$ is the electric potential at the contact pad at the bottom of the readout hole 550A and $\varphi_{top}$ is the electric potential at the contact pad at the bottom of the readout hole 550B.

Figure 7:
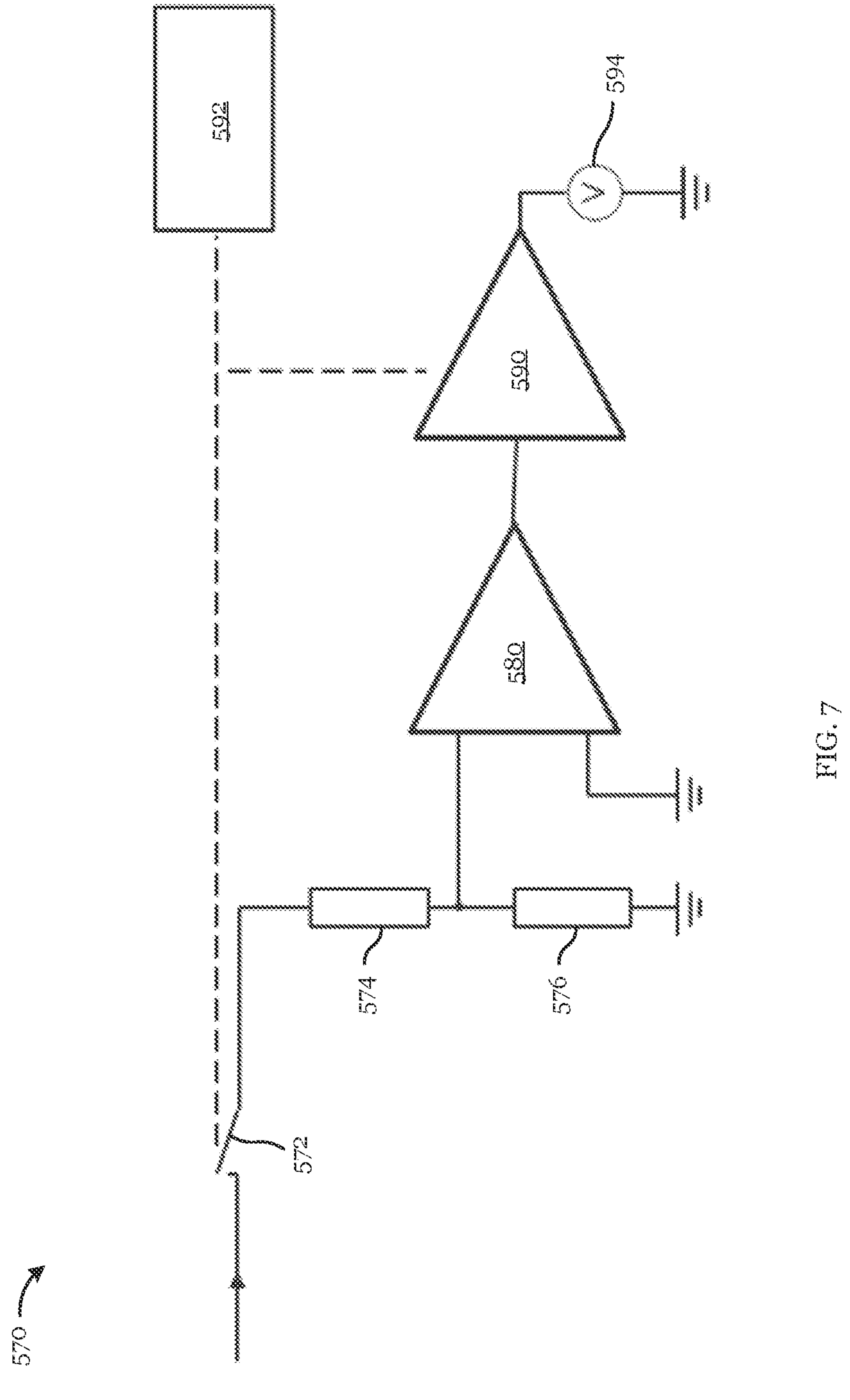
FIG. 7 illustrates a schematic diagram of a voltmeter circuit, in accordance with some embodiments.

FIG. 7 illustrates a schematic diagram of a voltmeter circuit 570, in accordance with some embodiments. A highly-ohmic impedance voltmeter is desirable to minimize capacitor discharging during measurements, such as measurements of the capacitors described above with respect to FIGS. 2A-2C and 3-6. As such, a simple voltage metrology circuit with an input impedance in a range of $10^{11}$ to $10^{12}$ ohms achieved by an open-circuit voltmeter with a sample-and-hold unit synchronized with the measurement circuit switch may be advantageous, such as for reading out remote sensors and/or integrated wafers as described above with respect to FIGS. 3-6.

A highly ohmic voltmeter may be achieved with a lower input resistive divider (such as on the order of giga-ohms) in combination with a mechanical contact relay (e.g., a breaker with an air gap resistance that is effectively infinite) and a sample and hold circuit. Triggering the air gap relay with the mechanical contacts for about 0.1 seconds with a duty cycle in a range of 1:10 to 1:100 may result in an increase of the effective time-averaged impedance of the input circuit by a factor of 10 to 100. In other words, the disclosed circuit may enable effective increase of the input impedance circuit by one to two orders of magnitude without a change in value of the resistive divider parameters.

The voltmeter circuit 570 comprises a mechanical relay 572 (e.g., an air gap) that receives a current I, a large resistor 574 coupled to the mechanical relay 572, and a small resistor 576 coupled between the large resistor 574 and a ground terminal opposite the mechanical relay 572. In various embodiments, the large resistor 574 has a first resistance R1 in a range of $10^6$ ohms to $10^{12}$ ohms, and the small resistor 574 has a second resistance R2 in a range of $10^3$ ohms to $10^9$ ohms, with the second resistance R2 being smaller than the first resistance R1. The node between the large resistor 574 and the small resistor 576 is further coupled to a first input terminal of an amplifier 580, with a second input terminal of the amplifier 580 coupled to a ground terminal.

An output terminal of the amplifier 580 is coupled to an input terminal of a sample and hold circuit 590. A sync generator 592 is coupled with the mechanical relay 572 and the sample and hold circuit 590 so that it opens and closes the mechanical relay 572 (such as opening it for about 0.1 seconds with a duty cycle in a range of 1:10 to 1:1,000,000) while providing a reference signal to the sample and hold circuit 590. As such, the input current I is $$I = (\text{Sampling Duty}) \times \frac{U_{in}}{R1 + R2},$$

where $U_{in}$ is the input voltage at the mechanical relay 572 and the Sampling Duty is the ratio between the total mechanical switch relay "ON" time per second and one second. An output terminal of the sample and hold circuit 590 is coupled to a ground terminal through a voltmeter 594, which may provide voltage measurements with good time resolution.

Figure 8:
FIGS. 8 through 14 illustrate cross-sectional views of intermediate stages of manufacturing an integrated wafer, in accordance with some embodiments.
Figure 8:
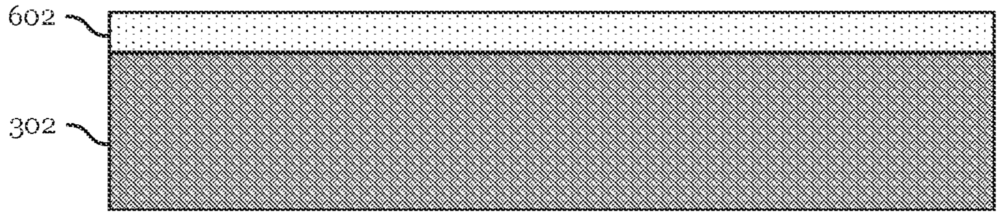

FIGS. 8 through 14 illustrate cross-sectional views of intermediate stages of manufacturing an integrated wafer 600, in accordance with some embodiments. The integrated wafer 600 may be used as a remote sensor in the same manner as described for the integrated wafers 300, 400, and 500 as described above with respect to FIGS. 3-6, and the details are not repeated herein. In FIG. 8, a dielectric layer 602 is formed over a substrate 302 (e.g., a silicon substrate such as a silicon wafer). In various embodiments, the dielectric layer 602 comprises silicon dioxide ($SiO_2$) and is formed with a thermal silicon dioxide deposition process. The dielectric layer 602 may have a thickness of about 1 μm. This may be advantageous for maintaining an electric field strength of about $10^3$ V/μm across the dielectric layer 602 between the silicon substrate and a subsequently formed conductive layer (see below, FIG. 9).

Figure 9:
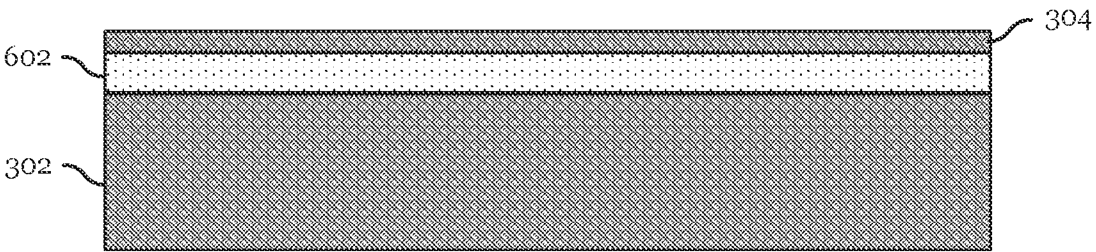

Next, in FIG. 9, a conductive layer 304 is formed over the dielectric layer 602. The conductive layer 304 may be formed using similar methods and materials as described above with respect to FIG. 3, and the details are not repeated herein. In various embodiments, the conductive layer 304 comprises titanium nitride and has a thickness of about 50 nm.

Figure 10:
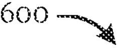
Figure 10:
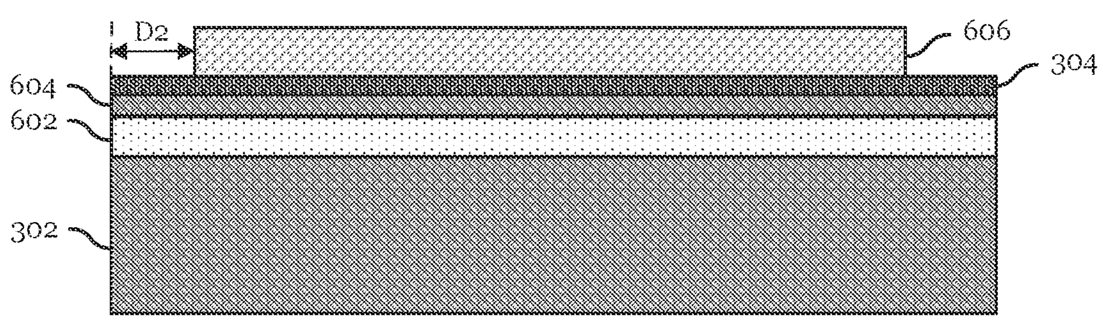

In FIG. 10, which follows from FIG. 9, a patterned photoresist 606 is formed over the conductive layer 304 and patterned with a suitable lithography technique. The patterned photoresist 606 has an outer edge separated from an outer sidewall of the substrate 302 (and the overlying layer(s) such as the conductive layer 304) by a distance D2 in a range of 5 mm to 10 mm (also referred to as an edge exclusion distance). The area of the integrated wafer 600 exposed by the patterned photoresist may be referred to as an edge exclusion area.

Figure 11:
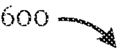
Figure 11:
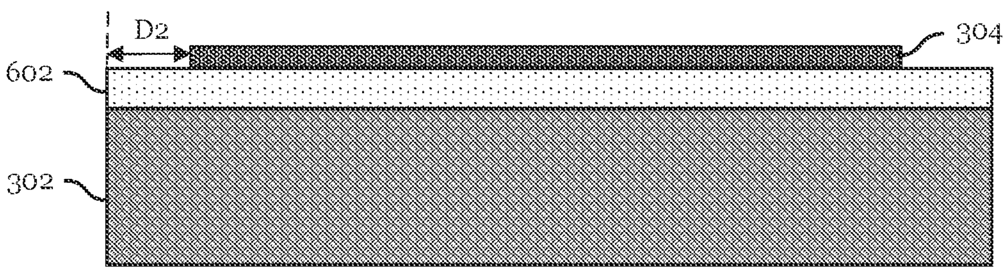

Next, in FIG. 11, the patterned photoresist 606 is used as an etch mask to etch exposed portions of the conductive layer 304 to expose a portion of the dielectric layer 602 in the edge exclusion area. The patterned photoresist 606 is subsequently removed by a suitable process such as an ashing. After removal of the portion of the conductive layer 304 in the edge exclusion region, the conductive layer 304 may have an initial capacitance with the underlying substrate 302 in a range of, for example, about 2 nF to about 10 μF, depending on the thickness of the dielectric layer 602.

Figure 12:
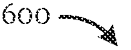
Figure 12:
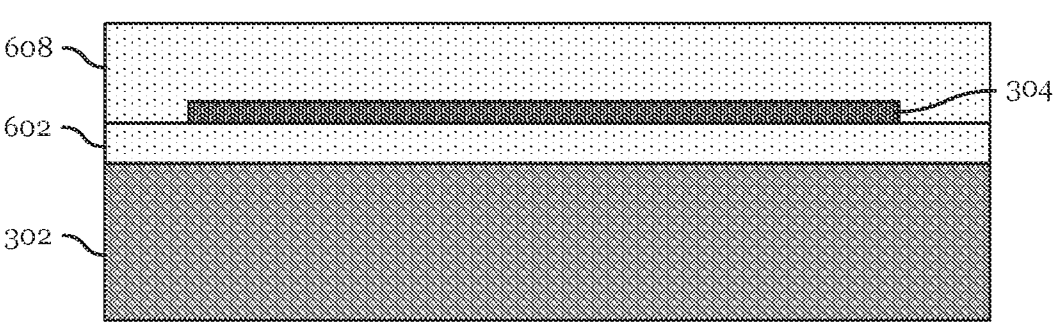

In FIG. 12, which follows from FIG. 11, a dielectric layer 608 is formed over exposed surfaces of the conductive layer 304 and the dielectric layer 602. The dielectric layer 608 fills the edge exclusion area and may have a substantially flat top surface. In some embodiments, the dielectric layer 608 comprises silicon dioxide ($SiO_2$) and is formed with a suitable process such as PECVD. The thickness of the dielectric layer 608 may be chosen to allow for holes to be subsequently formed through the dielectric layer 608 to expose portions of the conductive layer 304 with aspect ratio (AR) of about 50 and diameters of about 100 nm.

Figure 13:
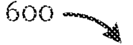
Figure 13:
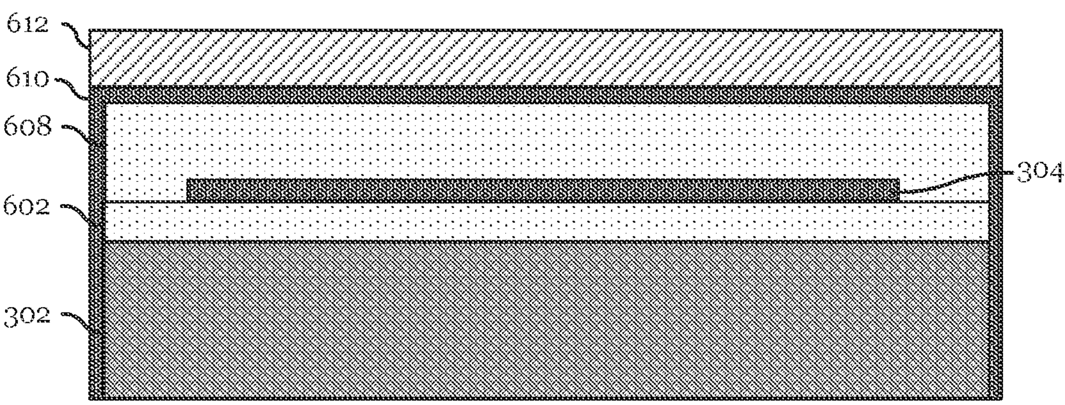

Next, in FIG. 13, a conductive layer 610 is formed over the dielectric layer 608 and a mask layer 612 is formed over the conductive layer 610. The conductive layer 610 may be formed using similar methods and materials as the conductive layer 304 as described above with respect to FIG. 3, and the details are not repeated herein. In various embodiments, the conductive layer 610 comprises titanium nitride and has a thickness of about 50 nm.

The conductive layer 610 may further be formed over respective sidewalls of the dielectric layers 608 and 602 and the substrate 302. As such, the conductive layer 610 has electrical contact with the substrate 302 at the edge of the integrated wafer 600, which may be advantageous for forming a shielded box comprising the substrate 302 and the conductive layer 610 around the conductive layer 304, which represents a current collecting electrode. In other words, the substrate 302 and the conductive layer 610 are analogous to the conductive enclosure of the remote sensor 200 (see above, FIG. 2) and the conductive layer 304 is analogous to the electrode 204 (see above, FIG. 2). Although not illustrated, in some embodiments the mask layer 612 covers sidewalls of the conductive layer 610.

The mask layer 612 is then formed over the conductive layer 610. The mask layer 612 may have a thickness of about 2.5 μm. The mask layer 612 may be formed using similar methods and materials as the mask layer 312 as described above with respect to FIG. 3, and the details are not repeated herein. In some embodiments, the mask layer 612 comprises amorphous carbon. In other embodiments, the mask layer 612 comprises a conductive material such as tungsten (W), titanium nitride (TiN), silicon (Si), or any other suitable conductive material such as described above for the conductive layer 304 with respect to FIG. 3.

Figure 14:
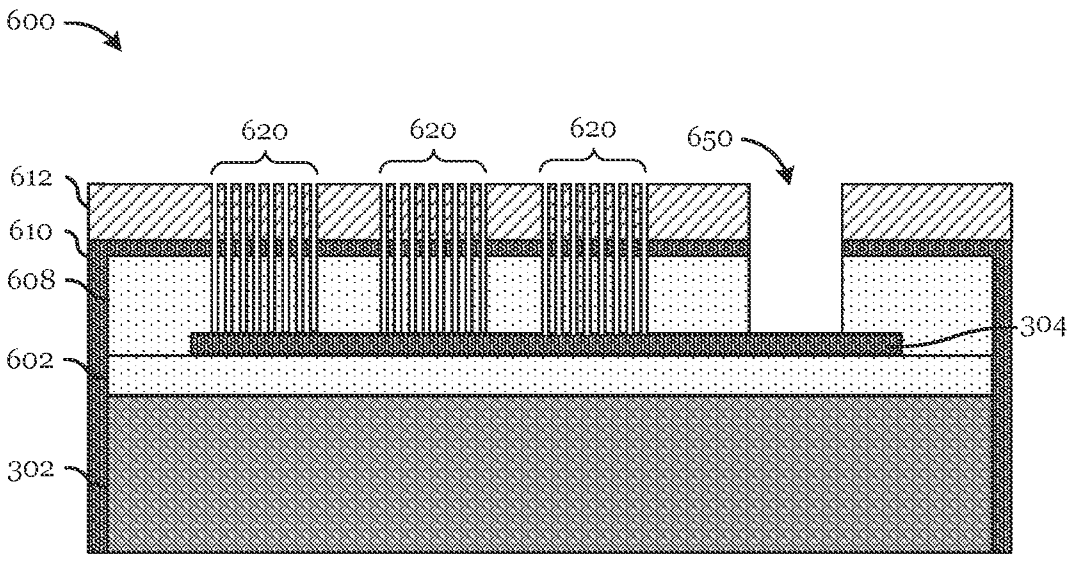

In FIG. 14, which follows from FIG. 13, one or more hole array(s) 620 and one or more contact hole(s) 650 are formed through the mask layer 612, conductive layer 610, and dielectric layer 608 to expose portions of the conductive layer 304.

The one or more hole array(s) 620 and one or more contact hole(s) 650 may be formed with a suitable lithography and etching process such as described above for the formation of the holes 320 with respect to FIG. 3, and the details are not repeated herein. In some embodiments, the holes of the one or more hole array(s) 620 have diameters of about 100 nm and total open bottom surface areas in a range of 0.1 $mm^2$ to 1 $mm^2$. In various embodiments, the one or more contact hole(s) 650 have diameters of about 5 mm. Bottom surfaces of the one or more contact hole(s) 650 (also referred to as pads) may have circular, square, oval, rectangular, or any other suitable shapes as seen from a top view.

The one or more hole array(s) 620 may be used to allow charged particles from a plasma through to charge the capacitance of the integrated wafer 600 during a plasma process test while the one or more contact hole(s) 650 are covered by a suitable removable shield (see above, FIG. 6). After the plasma process test is complete, the removable shield may be removed and the one or more contact hole(s) 650 may be coupled to a voltmeter (see above, FIG. 7) to read out the voltage of the capacitance of the integrated wafer 600.

Figure 15:
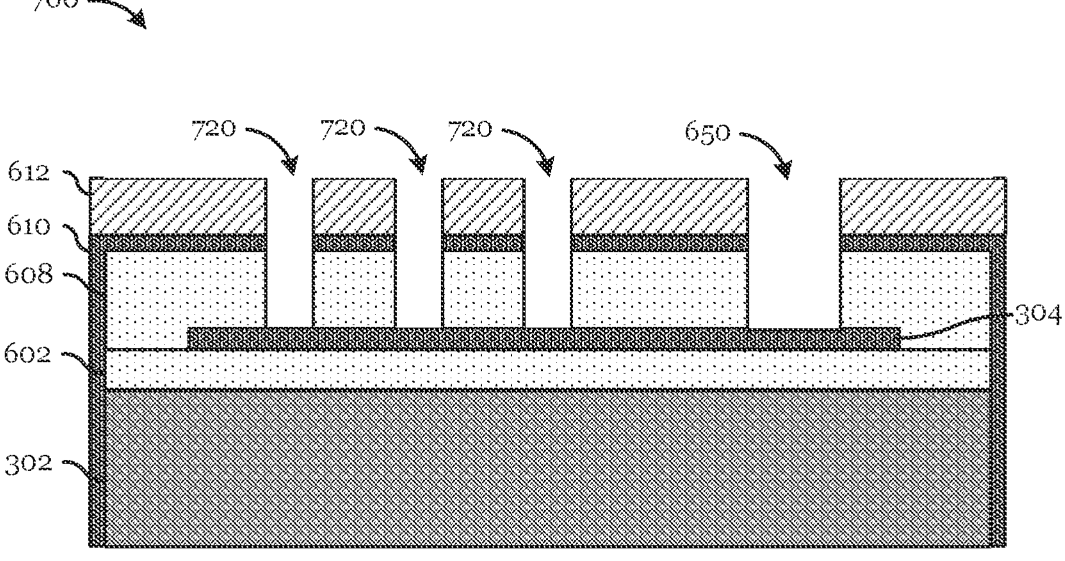
FIG. 15 illustrates a cross-sectional view of an intermediate stage of manufacturing another integrated wafer, in accordance with some embodiments.

FIG. 15 illustrates a cross-sectional view of an intermediate stage of manufacturing another integrated wafer 700, in accordance with some embodiments. The embodiment of the integrated wafer 700 differs from the embodiment of the integrated wafer 600 described above with respect to FIG. 15 by having one or more small hole(s) 720 rather than hole array(s) 620. The integrated wafer 700 may be manufactured using similar methods and materials as described for the integrated wafer 600 in FIGS. 8-13, and the details are not repeated herein.

Following FIG. 13, one or more small hole(s) 720 and one or more contact hole(s) 650 are formed through the mask layer 612, conductive layer 610, and dielectric layer 608 to expose portions of the conductive layer 304. The one or more small hole(s) 720 and one or more contact hole(s) 650 may be formed with a suitable lithography and etching process such as described above for the formation of the holes 320 with respect to FIG. 3, and the details are not repeated herein. In some embodiments, the one or more small hole(s) 720 have diameters of about 2 mm. The bottom surfaces of the one or more small hole(s) 720 (also referred to as pads) may have circular, square, oval, rectangular, or any other suitable shapes as seen from a top view. The one or more small hole(s) 720 may be used to allow charged particles from a plasma through to charge the capacitance of the integrated wafer 700 during a plasma process test while the one or more contact hole(s) 650 are covered by a suitable removable shield (see above, FIG. 6).

Figure 16:
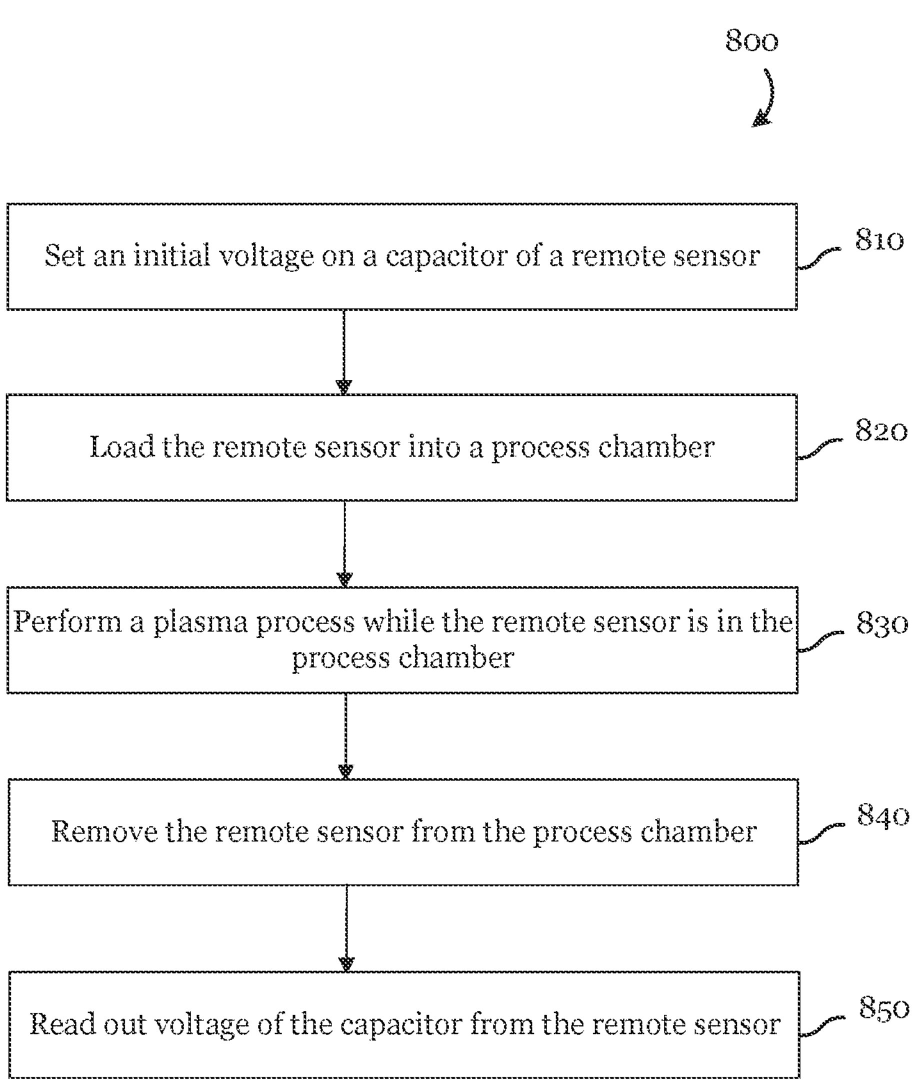
FIG. 16 illustrates a process flow chart diagram of a method for plasma processing, in accordance with some embodiments.

FIG. 16 illustrates a process flow chart diagram of a method 800 for plasma processing, in accordance with some embodiments. In step 810, an initial voltage is set on a capacitor of a remote capacitive sensor (e.g., a remote sensor 200 as described above with respect to FIGS. 2A-2C or an integrated wafer 300, 400, 500, 600, or 700 as described above with respect to FIGS. 3-6 and 14-15). The initial voltage may be set to either positive or negative, which may be advantageous for selecting measuring either ion current (for ion angle distribution estimation) or electron current (for plasma density estimation), as described above with respect to FIGS. 2D-2E.

Next, in step 820, the remote capacitive sensor is loaded into a process chamber, such as mounted on a substrate holder 105 of a plasma processing chamber 110 (see above, FIG. 1). In step 830, following from step 820, a plasma process is performed while the remote capacitive sensor is in the process chamber, as described above with respect to FIGS. 2B and 2C. This may charge the capacitor of the remote capacitive sensor for a process running time t.

Next, in step 840, the remote capacitive sensor is removed from the process chamber, such as after the end of the plasma process. In step 850, following from step 840, the voltage of the capacitor is read out from the remote capacitive sensor, such as by coupling it with a voltmeter circuit 570 as described above with respect to FIG. 7. However, any suitable voltmeter may be used to read out the voltage of the capacitor. The measured voltage in combination with the process running time t allows for the computation of the charging rate dV/dt, which may provide information on sidewall potential distribution, ion current versus etch depth, angular ion distribution, and estimation of electron current and plasma density, as described above with respect to FIGS. 2D and 2E.

Figure 17:
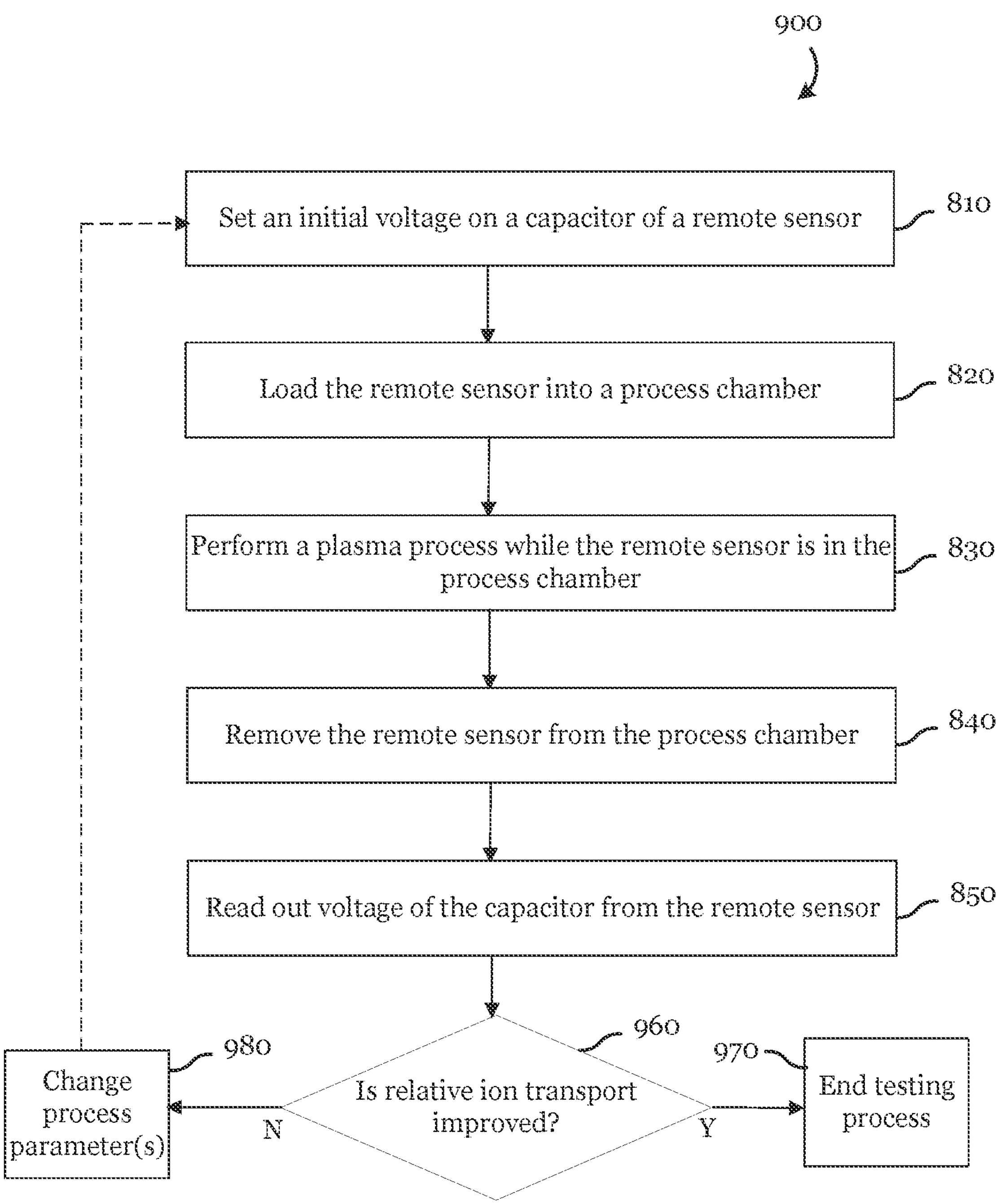
FIG. 17 illustrates a process flow chart diagram of a method for plasma processing, in accordance with some embodiments.

FIG. 17 illustrates a process flow chart diagram of a method 900 for plasma processing, in accordance with some embodiments. Steps 810 through 850 are the same as the steps 810 through 850 of method 800 as described above with respect to FIG. 16, and the details are not repeated herein. In step 960, following from step 850, the voltage read out from the capacitor is tested to determine if relative ion transport (such as through capillaries of the remote sensor) has improved. If relative ion transport has improved and reached a desired level, the method 900 proceeds to step 970 and the testing process ends with desired plasma process parameters having been found. If relative ion transport has not improved or has not reached a desired level, the method 900 proceeds to step 980.

In step 980, one or more of the plasma process parameters are changed or adjusted using information obtained from the voltage read out from the capacitor. For example, parameters such as source power, bias power, bias waveform, process chemistry, and/or operating pressure may be adjusted. After step 980, the method 900 returns to step 810 for another test cycle with the changed or adjusted process parameters. Method 900 may repeat the steps of testing the voltage of the capacitor and performing additional test cycles for any suitable number of cycles until relative ion transport reaches a desired level. In some embodiments, another property other than relative ion transport (e.g., plasma density) is optimized by the method 900.

Example embodiments of the disclosure are summarized here. Other embodiments can also be understood from the entirety of the specification as well as the claims filed herein.

Example 1. An apparatus for plasma measurement, the apparatus including: an electrode within a remote capacitive sensor; a capacitor within the remote capacitive sensor, the capacitor coupled with the electrode; and a capillary array disposed within a top surface of the remote capacitive sensor, the capillary array being configured to allow charged particles to pass through the capillary array and charge the capacitor.

Example 2. The apparatus of example 1, where the remote capacitive sensor includes a metal box, the metal box containing the electrode and the capacitor.

Example 3. The apparatus of one of examples 1 or 2, where the remote capacitive sensor further includes a semiconductor wafer and a multi-layer stack over the semiconductor wafer.

Example 4. The apparatus of example 3, where capillaries of the capillary array extend into the multi-layer stack to expose portions of a first conductive layer of the multi-layer stack.

Example 5. The apparatus of example 4, where the capacitor includes the first conductive layer of the multi-layer stack, a second conductive layer of the multi-layer stack, and a dielectric layer of the multi-layer stack, the dielectric layer being between the first conductive layer and the second conductive layer.

Example 6. The apparatus of one of examples 1 to 5, where the remote capacitive sensor is free of batteries and transistors.

Example 7. An apparatus for plasma measurement, the apparatus including: a first conductive layer over a substrate; a first dielectric layer over the first conductive layer; a second conductive layer over the first dielectric layer; a mask layer over the second conductive layer; a first hole through the mask layer, the second conductive layer, and the first dielectric layer, the first hole exposing a first portion of the first conductive layer; a first readout hole through the mask layer, the second conductive layer, and the first dielectric layer, the first hole exposing a second portion of the first conductive layer, the second portion having a greater surface area than the first portion; and a second readout hole through the mask layer and the first dielectric layer, the second readout hole exposing a third portion of the second conductive layer, the third portion having a greater surface area than the first portion.

Example 8. The apparatus of example 7, further including a removable shield covering the first readout hole and the second readout hole.

Example 9. The apparatus of one of examples 7 or 8, where the first conductive layer and the second conductive layer include a metal, titanium nitride, or doped silicon.

Example 10. The apparatus of one of examples 7 to 9, where the first dielectric layer includes an oxide, silicon nitride, or aluminum oxide.

Example 11. The apparatus of one of examples 7 to 10, where the mask layer includes amorphous carbon.

Example 12. The apparatus of one of examples 7 to 11, where the first hole is part of an array of holes extending through the mask layer, the second conductive layer, and the first dielectric layer to expose the first conductive layer.

Example 13. The apparatus of one of examples 7 to 12, further including: a third conductive layer between the first conductive layer and the substrate; and a second dielectric layer between the third conductive layer and the first conductive layer.

Example 14. The apparatus of example 13, further including a second hole through the mask layer, the second conductive layer, the first dielectric layer, the first conductive layer, and the second dielectric layer, the second hole exposing a fourth portion of the third conductive layer.

Example 15. The apparatus of example 14, further including a third readout hole through the mask layer, the second conductive layer, the first dielectric layer, the first conductive layer, and the second dielectric layer, the third readout hole exposing a fifth portion of the third conductive layer, the fifth portion having a greater surface area than the fourth portion.

Example 16. The apparatus of one of examples 7 to 15, further including a voltmeter couplable to the second portion of the first conductive layer, the voltmeter having an input impedance, a product of the input impedance with a capacitance between the first conductive layer and the second conductive layer being greater than 50 seconds.

Example 17. The apparatus of one of examples 7 to 16, where the substrate includes a silicon wafer.

Example 18. A method for plasma measurement, the method including a test cycle, the test cycle including: setting an initial voltage on a capacitor of a remote capacitive sensor; loading the remote capacitive sensor into a process chamber; performing a plasma process in the process chamber while the remote capacitive sensor is in the process chamber; removing the remote capacitive sensor from the process chamber; and reading out voltage of the capacitor from the remote capacitive sensor.

Example 19. The method of example 18, where reading out the voltage of the capacitor includes coupling a first contact pad and a second contact pad of the remote capacitive sensor with a voltmeter, the voltmeter having an input impedance, a product of the input impedance with a capacitance of the capacitor being greater than 50 seconds.

Example 20. The method of one of examples 18 or 19, further including: testing the voltage of the capacitor to determine if relative ion transport is improved; performing another test cycle with a plasma process parameter adjusted using the voltage of the capacitor; and repeating the steps of testing the voltage of the capacitor and performing additional test cycles until relative ion transport reaches a desired level.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for plasma measurement, the apparatus comprising:

an electrode within a remote capacitive sensor;

a capacitor within the remote capacitive sensor, the capacitor coupled with the electrode; and a capillary array disposed within a top surface of the remote capacitive sensor, the capillary array being configured to allow charged particles from a plasma to pass through the capillary array and charge the capacitor.

2. The apparatus of claim 1, wherein the remote capacitive sensor comprises a metal box, the metal box containing the electrode and the capacitor.

3. The apparatus of claim 1, wherein the remote capacitive sensor further comprises a semiconductor wafer and a multi-layer stack over the semiconductor wafer.

4. The apparatus of claim 3, wherein capillaries of the capillary array extend into the multi-layer stack to expose portions of a first conductive layer of the multi-layer stack.

5. The apparatus of claim 4, wherein the capacitor comprises the first conductive layer of the multi-layer stack, a second conductive layer of the multi-layer stack, and a dielectric layer of the multi-layer stack, the dielectric layer being between the first conductive layer and the second conductive layer.

6. The apparatus of claim 1, wherein the remote capacitive sensor is free of batteries and transistors.

7. An apparatus for plasma measurement, the apparatus comprising:

a first conductive layer over a substrate;

a first dielectric layer over the first conductive layer;

a second conductive layer over the first dielectric layer;

a mask layer over the second conductive layer;

a first hole through the mask layer, the second conductive layer, and the first dielectric layer, the first hole exposing a first portion of the first conductive layer;

a first readout hole through the mask layer, the second conductive layer, and the first dielectric layer, the first readout hole exposing a second portion of the first conductive layer, the second portion having a greater surface area than the first portion; and a second readout hole through the mask layer, the second readout hole exposing a third portion of the second conductive layer, the third portion having a greater surface area than the first portion.

8. The apparatus of claim 7, further comprising a removable shield covering the first readout hole and the second readout hole.

9. The apparatus of claim 7, wherein the first conductive layer and the second conductive layer comprise a metal, titanium nitride, or doped silicon.

10. The apparatus of claim 7, wherein the first dielectric layer comprises an oxide, silicon nitride, or aluminum oxide.

11. The apparatus of claim 7, wherein the mask layer comprises amorphous carbon.

12. The apparatus of claim 7, wherein the first hole is part of an array of holes extending through the mask layer, the second conductive layer, and the first dielectric layer to expose the first conductive layer.

13. The apparatus of claim 7, further comprising: a third conductive layer between the first conductive layer and the substrate; and a second dielectric layer between the third conductive layer and the first conductive layer.

14. The apparatus of claim 13, further comprising a second hole through the mask layer, the second conductive layer, the first dielectric layer, the first conductive layer, and the second dielectric layer, the second hole exposing a fourth portion of the third conductive layer.

15. The apparatus of claim 14, further comprising a third readout hole through the mask layer, the second conductive layer, the first dielectric layer, the first conductive layer, and the second dielectric layer, the third readout hole exposing a fifth portion of the third conductive layer, the fifth portion having a greater surface area than the fourth portion.

16. The apparatus of claim 7, further comprising a voltmeter couplable to the second portion of the first conductive layer, the voltmeter having an input impedance, a product of the input impedance with a capacitance between the first conductive layer and the second conductive layer being greater than 50 seconds.

17. The apparatus of claim 7, wherein the substrate comprises a silicon wafer.

18. A method for plasma measurement, the method comprising a test cycle, the test cycle comprising:

setting an initial voltage on a capacitor of a remote capacitive sensor;

loading the remote capacitive sensor into a process chamber;

performing a plasma process in the process chamber while the remote capacitive sensor is in the process chamber;

removing the remote capacitive sensor from the process chamber; and reading out a voltage of the capacitor from the remote capacitive sensor.

19. The method of claim 18, wherein reading out the voltage of the capacitor comprises coupling a first contact pad and a second contact pad of the remote capacitive sensor with a voltmeter, the voltmeter having an input impedance, a product of the input impedance with a capacitance of the capacitor being greater than 50 seconds.

20. The method of claim 18, further comprising:

testing the voltage of the capacitor to determine if relative ion transport is improved;

performing another test cycle with a plasma process parameter adjusted using the voltage of the capacitor; and repeating the steps of testing the voltage of the capacitor and performing additional test cycles until relative ion transport reaches a desired level.

* * * * *